(12) United States Patent
Jang et al.

(10) Patent No.: US 11,737,333 B2
(45) Date of Patent: Aug. 22, 2023

(54) ORGANIC LIGHT EMITTING DIODE DISPLAY DEVICE INCLUDING WAVELENGTH CONVERTING LAYERS

(71) Applicant: LG Display Co., Ltd., Seoul (KR)

(72) Inventors: Ji-Hyang Jang, Paju-si (KR); Tae-Shick Kim, Paju-si (KR); So-Young Jo, Paju-si (KR); Jin-Tae Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 329 days.

(21) Appl. No.: 17/111,279

(22) Filed: Dec. 3, 2020

(65) Prior Publication Data

US 2021/0175290 A1    Jun. 10, 2021

(30) Foreign Application Priority Data

Dec. 5, 2019 (KR) .................. 10-2019-0160623

(51) Int. Cl.
*H10K 59/38* (2023.01)
*H10K 50/858* (2023.01)
*H10K 50/13* (2023.01)
*H10K 59/12* (2023.01)

(52) U.S. Cl.
CPC ........... *H10K 59/38* (2023.02); *H10K 50/858* (2023.02); *H10K 50/13* (2023.02); *H10K 59/12* (2023.02)

(58) Field of Classification Search
None
See application file for complete search history.

(56) References Cited

U.S. PATENT DOCUMENTS

| | | | | |
|---|---|---|---|---|
| 2006/0192485 A1* | 8/2006 | Song | .................. | H01L 51/5275 |
| | | | | 313/506 |
| 2010/0219429 A1* | 9/2010 | Cok | ..................... | H10K 50/865 |
| | | | | 257/89 |
| 2013/0082589 A1* | 4/2013 | So | ........................ | H10K 59/351 |
| | | | | 313/504 |
| 2019/0181384 A1* | 6/2019 | Forrest | ................ | G02B 3/0056 |
| 2020/0168668 A1* | 5/2020 | Kim | .................. | H01L 51/5271 |
| 2020/0395568 A1* | 12/2020 | Seo | ..................... | H01L 51/5076 |
| 2022/0115629 A1* | 4/2022 | Suzuki | .............. | G02B 19/0066 |

* cited by examiner

*Primary Examiner* — Nduka E Ojeh
(74) *Attorney, Agent, or Firm* — Polsinelli PC

(57) ABSTRACT

An organic light emitting diode display device includes a substrate having first, second, third and fourth subpixels; first, second and third color filter layers in the second, third and fourth subpixels, respectively, on the substrate; a first wavelength converting layer in the first subpixel on the substrate and second and third wavelength converting layers on the first and second color filter layers, respectively; and a light emitting diode in each of the first, second, third and fourth subpixels over the first, second and third wavelength converting.

17 Claims, 10 Drawing Sheets

ORGANIC LIGHT EMITTING DIODE DISPLAY DEVICE INCLUDING WAVELENGTH CONVERTING LAYERS

CROSS-REFERENCE TO RELATED APPLICATION

The present application claims the priority benefit of Korean Patent Application No. 10-2019-0160623 filed on Dec. 5, 2019, which is hereby incorporated by reference in its entirety.

BACKGROUND

Field of the Disclosure

The present disclosure relates to an organic light emitting diode display device, and more particularly, to an organic light emitting diode display device including a wavelength converting layer.

Description of the Background

Recently, a flat panel display (FPD) having a thin profile, a light weight and a low power consumption has been developed and applied to various fields.

In an organic light emitting diode (OLED) display device among flat panel displays, charges are injected into a light emitting layer between a cathode of an electron injecting electrode and an anode of a hole injecting electrode to form an exciton, and the exciton transitions from an excited state to a ground state to emit a light.

A white OLED display device used as a display device of a high resolution and a small size for a virtual reality (VR) or an augmented reality (AR) or a display device of a big size for a television has been researched and developed.

The white OLED display device includes a light emitting layer emitting a white colored light and a color filter layer transmitting a light of a specific color (specific wavelength). For example, the white OLED display device includes a white subpixel, a red subpixel, a green subpixel and a blue subpixel emitting a white colored light, a red colored light, a green colored light and a blue colored light, respectively.

In the white OLED display device, the light emitting layer has a tandem structure including a plurality of stacks for emitting a white colored light of a relatively high color temperature and a relatively high luminance, and one of the plurality of stacks includes two or more dopants for emitting a light of two or more colors.

However, a difference in a charge distribution according to a current density and a difference in a white spectrum occur due to a combination of the two or more dopants in the one of the plurality of stacks. As a result, a difference in a white color temperature of gray levels clearly occurs in the white OLED display device.

To solve the above problems, a material for the light emitting layer emitting the white colored light may be changed or a composition ratio of materials for the light emitting layer emitting the white colored light may be adjusted. However, the change of the material or the adjustment range of the composition ratio is intensely limited and has a high level of difficulty.

SUMMARY

Accordingly, the present disclosure is directed to an organic light emitting diode display device that substantially obviates one or more of the problems due to limitations and disadvantages of the related art.

Also, the present disclosure is to provide an organic light emitting diode display device where a white spectrum of a relatively high color temperature and a relatively high luminance is stably obtained by converting a white colored light of a light emitting layer into a light of a different color using a wavelength converting layer.

In addition, the present disclosure is to provide an organic light emitting diode display device where various white spectrums are obtained and a color reproducibility is improved by converting a white colored light of a light emitting layer into a light of a different color using a wavelength converting layer and by transmitting a light of a predetermined color of the white colored light of the light emitting layer using a color filter layer.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, an organic light emitting diode display device includes: a substrate having first, second, third and fourth subpixels; first, second and third color filter layers in the second, third and fourth subpixels, respectively, on the substrate; a first wavelength converting layer in the first subpixel on the substrate and second and third wavelength converting layers on the first and second color filter layers, respectively; and a light emitting diode in each of the first, second, third and fourth subpixels over the first, second and third wavelength converting.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate aspects of the disclosure and together with the description serve to explain the principles of the disclosure.

In the drawings.

DETAILED DESCRIPTION

Figure 1:
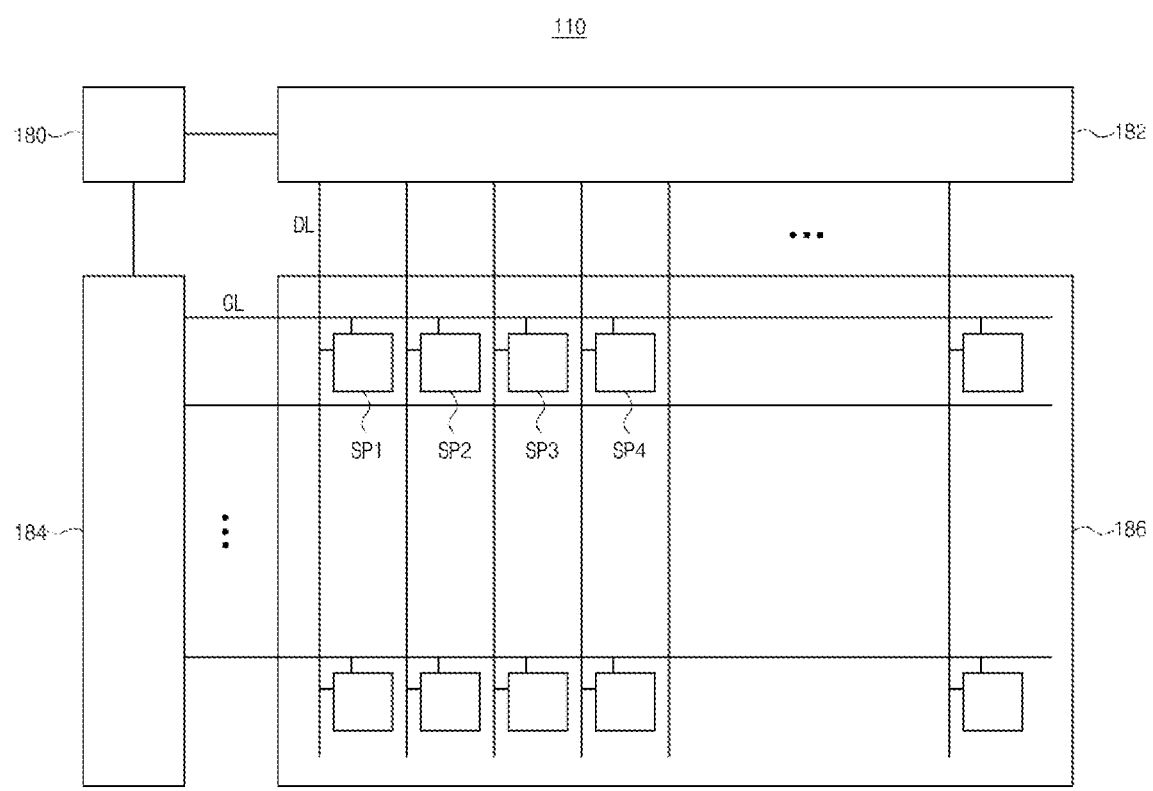
FIG. 1 is a view showing an organic light emitting diode display device according to a first aspect of the present disclosure.

Reference will now be made in detail to aspects of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following example aspects described with reference to the accompanying drawings. The present disclosure may, however, be embodied in different forms and should not be construed as limited to the example aspects set forth herein. Rather, these example aspects are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing aspects of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used.

In describing a time relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of aspects, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and aspects of the present disclosure are not limited thereto.

Features of various aspects of the present disclosure may be partially or overall coupled to or combined with each other, and may be variously inter-operated with each other and driven technically as those skilled in the art can sufficiently understand. Aspects of the present disclosure may be carried out independently from each other, or may be carried out together in co-dependent relationship.

Reference will now be made in detail to the present disclosure, examples of which are illustrated in the accompanying drawings.

Figure 2:
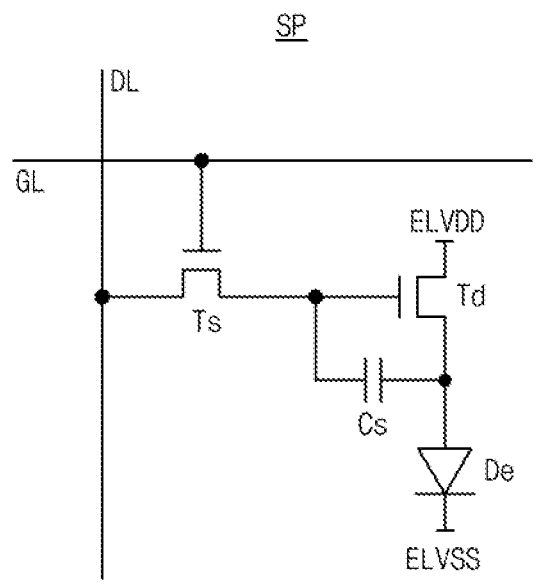
FIG. 2 is a view showing a subpixel of an organic light emitting diode display device according to the first aspect of the present disclosure.

FIG. 1 is a view showing an organic light emitting diode display device according to a first aspect of the present disclosure, and FIG. 2 is a view showing a subpixel of an organic light emitting diode display device according to a first aspect of the present disclosure.

In FIG. 1, an organic light emitting diode (OLED) display device 110 includes a timing controlling part 180, a data driving part 182, a gate driving part 184 and a display panel 186.

The timing controlling part 180 generates a gate control signal, a data control signal and an image data using an image signal and a plurality of timing signals transmitted from an external system such as a graphic card or a television system. The timing controlling part 180 supplies the data control signal and the image data to the data driving part 182 and supplies the gate control signal to the gate driving part 184.

The data driving part 182 generates a data signal (a data voltage) using the data control signal and the image data transmitted from the timing controlling part 180 and supplies the data voltage to a data line DL of the display panel 186.

The gate driving part 184 generates a gate signal (a gate voltage) using the gate control signal transmitted from the timing controlling part 180 and supplies the gate voltage to a gate line GL of the display panel 186.

The display panel 186 displays an image using the gate signal and the data signal. The display panel 186 includes the gate line GL, the data line DL and a plurality of subpixels SP (shown in FIG. 2) connected to the gate line GL and the data line DL.

For example, each of the plurality of subpixels SP may be defined by the gate line GL and the data line DL crossing each other, and the plurality of subpixels SP may include first, second, third and fourth subpixels SP1, SP2, SP3 and SP4 corresponding to white, red, green and blue colors, respectively.

Each of the plurality of subpixels SP includes a plurality of thin film transistors (TFTs). For example, each of the plurality of subpixels SP may include a switching TFT, a driving TFT, a storage capacitor and a light emitting diode.

In FIG. 2, each of the plurality of subpixels SP of the OLED display device 110 according to the present disclosure includes a switching TFT Ts, a driving TFT Td, a storage capacitor Cs and a light emitting diode De.

The switching TFT Ts supplies the data signal of the data line DL to the driving TFT Td according to the gate signal of the gate line GL, and the driving TFT Td supplies a high level voltage ELVDD to the light emitting diode De according to the data signal applied to a gate electrode through the switching TFT Ts.

The light emitting diode De displays various gray levels using various currents according to voltage differences between a voltage corresponding to the data signal and a low level voltage ELVSS.

Figure 3:
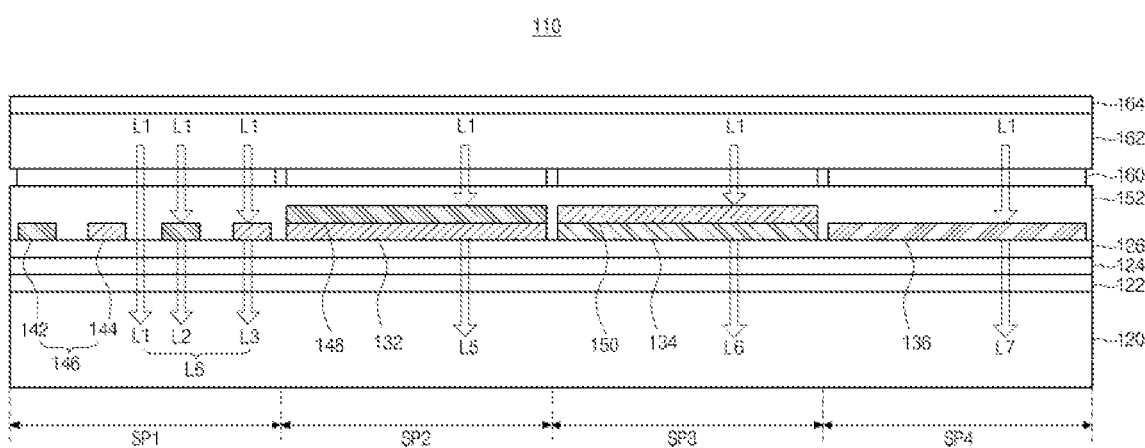
FIG. 3 is a cross-sectional view showing an organic light emitting diode display device according to the first aspect of the present disclosure.

FIG. 3 is a cross-sectional view showing an organic light emitting diode display device according to a first aspect of the present disclosure. FIG. 3 exemplarily shows a bottom emission type organic light emitting diode display device.

In FIG. 3, the OLED display device 110 includes a substrate 120, insulating layers 122, 124 and 126, color filter layers 132, 134 and 136, wavelength converting layers 146, 148 and 150, a first electrode 160, a light emitting layer 162 and a second electrode 164.

The substrate 120 includes first to fourth subpixels SP1 to SP4. For example, the first, second, third and fourth subpixels SP1, SP2, SP3 and SP4 may correspond to white, red, green and blue colors, respectively.

For example, the first to fourth subpixels SP1 to SP4 may constitute a single pixel. The first subpixel SP1 may have an area ratio of about 0.3 (30%) to about 0.7 (70%) with respect to the single pixel, and each of the second, third and fourth subpixels SP2, SP3 and SP4 may have an area ratio of about 0.1 (10%) to about 0.3 (30%).

A gate insulating layer 122, an interlayer insulating layer 124 and a passivation layer 126 may be disposed in the first, second, third and fourth subpixels SP1, SP2, SP3 and SP4 on the substrate 120, and the switching TFT Ts (shown in FIG. 2), the driving TFT Td (shown in FIG. 2) and the storage capacitor Cs (shown in FIG. 2) may be disposed among the gate insulating layer 122, the interlayer insulating layer 124 and the passivation layer 126.

For example, the gate insulating layer 122 may be disposed between a gate electrode and a semiconductor layer of the switching TFT Ts and the driving TFT Td, and the interlayer insulating layer 124 may be disposed between the gate electrode and a source electrode and between the gate electrode and a drain electrode of the switching TFT Ts and the driving TFT Td. The passivation layer 126 may be disposed on the source electrode and the drain electrode of the switching TFT Ts and the driving TFT Td.

First, second and third color filter layers 132, 134 and 136 may be disposed in the second, third and fourth subpixels SP2, SP3 and SP4 on the passivation layer 126. For example, the first, second and third color filter layers 132, 134 and 136 may be selectively penetrated by and may selectively transmit a red colored light, a green colored light and a blue colored light, respectively.

A first wavelength converting layer 146 is disposed in the first subpixel SP1 on the passivation layer 126, and second and third wavelength converting layers 148 and 150 are disposed on the first and second color filter layers 132 and 134, respectively.

The first wavelength converting layer 146 includes first and second wavelength converting materials, and the second wavelength converting layer 148 includes a third wavelength converting material. The third wavelength converting layer 150 includes a fourth wavelength converting material.

The first, second, third and fourth wavelength converting materials of the first, second and third wavelength converting layers 146, 148 and 150 absorb a light of a short wavelength and emits a light of a long wavelength.

For example, the first, second, third and fourth wavelength converting materials may include a quantum dot or a nanocomposite capable of adjusting an absorption wavelength band and an emission wavelength band according to a concentration or a sort of substances.

The first, second, third and fourth wavelength converting materials may have an absorption wavelength band of about 350 nm to about 650 nm and an emission wavelength band of about 450 nm to about 750 nm. An absorption ratio by wavelength and an emission ratio by wavelength of the first, second, third and fourth wavelength converting materials may be adjusted according to a composition ratio or a sort of substances.

The first and third wavelength converting materials may be the same as each other, and the second and fourth wavelength converting materials may be the same as each other.

The first and second wavelength converting materials may have different absorption wavelength bands and different emission wavelength bands from each other, and the third and fourth wavelength converting materials may have different absorption wavelength bands and different emission wavelength bands from each other.

For example, the first and third wavelength converting materials may have an absorption wavelength band of about 450 nm to about 650 nm and an emission wavelength band of about 550 nm to about 750 nm, and the second and fourth wavelength converting materials may have an absorption wavelength band of about 350 nm to about 550 nm and an emission wavelength band of about 450 nm to about 650 nm.

As a result, the first and third wavelength converting materials may absorb a blue colored light and may emit a red colored light, and the second and fourth wavelength converting materials may absorb a blue colored light and may emit a green colored light.

In another aspect, a blue color filter layer may be disposed on each of the second and third wavelength converting layers 148 and 150 of the second and third subpixels SP2 and SP3. As a result, an incident light to the second and third wavelength converting layers 148 and 150 may be limited to the blue colored light to increase a wavelength conversion efficiency.

The first wavelength converting layer 146 may include a first wavelength converting pattern 142 containing the first wavelength converting material and a second wavelength converting pattern 144 containing the second wavelength converting material.

Figure 4:
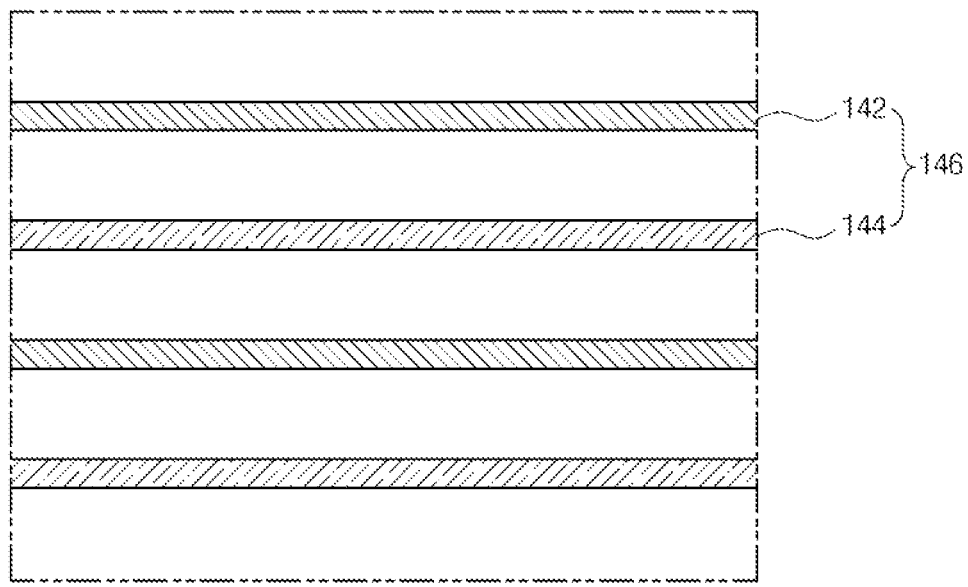
FIG. 4 is a plan view showing a first wavelength converting layer of an organic light emitting diode display device according to the first aspect of the present disclosure.
Figure 5:
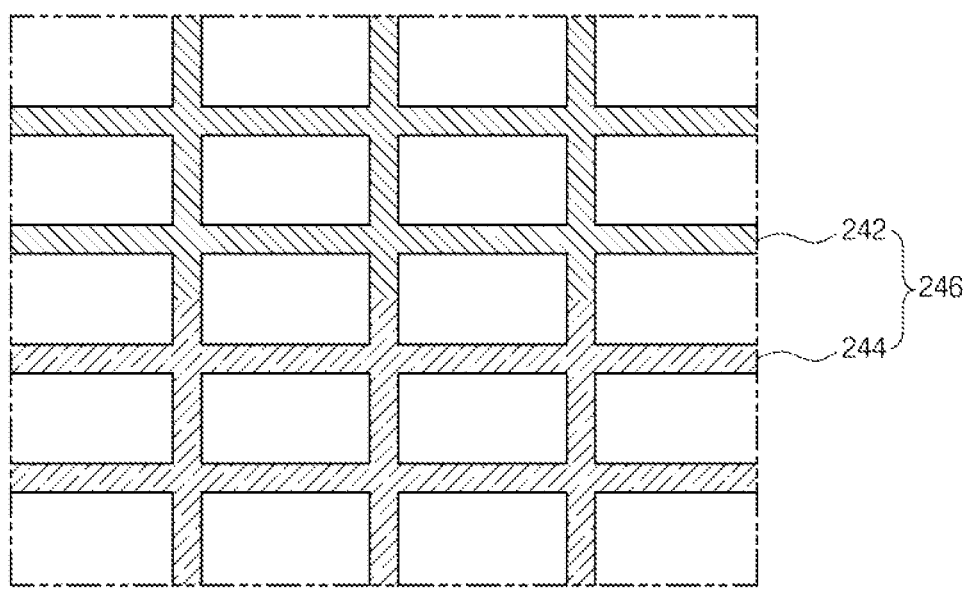
FIG. 5 is a plan view showing a first wavelength converting layer of an organic light emitting diode display device according to a second aspect of the present disclosure.
Figure 6:
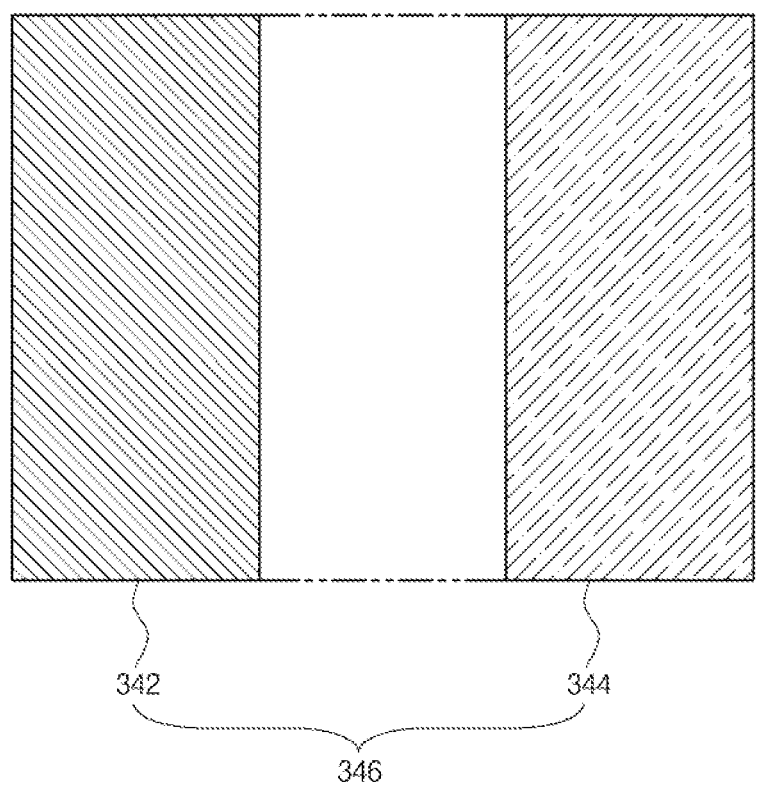
FIG. 6 is a plan view showing a first wavelength converting layer of an organic light emitting diode display device according to a third aspect of the present disclosure.

FIGS. 4, 5 and 6 are plan views showing a first wavelength converting layer of an organic light emitting diode display device according to first, second and third aspects, respectively, of the present disclosure.

In FIG. 4, the first wavelength converting layer 146 including the first wavelength converting pattern 142 containing the first wavelength converting material and the second wavelength converting pattern 144 containing the second wavelength converting material is disposed in the first subpixel SP1 of the OLED display device 110 according to a first aspect of the present disclosure.

The first and second wavelength converting patterns 142 and 144 may have a shape of a plurality of bars and may be disposed parallel to and alternate with each other.

As a result, the first subpixel SP1 may be classified into a first region where the first wavelength converting material is disposed, a second region where the second wavelength converting material is disposed and a third region between the first and second wavelength converting patterns 142 and 144 where the first and second wavelength converting materials are not disposed. A white spectrum of a white colored light emitted from the first subpixel SP1 may be variously adjusted by changing area ratios of the first to third regions.

In FIG. 5, a first wavelength converting layer 246 including a first wavelength converting pattern 242 containing a first wavelength converting material and a second wavelength converting pattern 244 containing a second wavelength converting material is disposed in a first subpixel SP1 of an OLED display device according to a second aspect of the present disclosure.

The first and second wavelength converting patterns 242 and 244 may have a shape of a net.

As a result, the first subpixel SP1 may be classified into a first region where the first wavelength converting material is disposed, a second region where the second wavelength converting material is disposed and a third region between the first and second wavelength converting patterns 242 and 244 where the first and second wavelength converting materials are not disposed. A white spectrum of a white colored light emitted from the first subpixel SP1 may be variously adjusted by changing area ratios of the first to third regions.

In FIG. 6, a first wavelength converting layer 346 including a first wavelength converting pattern 342 containing a first wavelength converting material and a second wavelength converting pattern 344 containing a second wavelength converting material is disposed in a first subpixel SP1 of an OLED display device according to a third aspect of the present disclosure.

The first and second wavelength converting patterns 342 and 344 may have a shape of a rectangle and may be separated from each other to be disposed parallel to each other and at side portions of the first subpixel SP1.

As a result, the first subpixel SP1 may be classified into a first region where the first wavelength converting material is disposed, a second region where the second wavelength converting material is disposed and a third region between the first and second wavelength converting patterns 342 and 344 where the first and second wavelength converting materials are not disposed. A white spectrum of a white colored light emitted from the first subpixel SP1 may be variously adjusted by changing area ratios of the first to third regions.

Referring again to FIG. 3, a first planarizing layer 152 is disposed on the first, second and third wavelength converting layers 146, 148 and 150 and the third color filter layer 136.

For example, the first planarizing layer 152 may include an organic insulating material such as a photo acryl.

A first electrode 160, a light emitting layer 162 and a second electrode 164 are sequentially disposed in the first, second, third and fourth subpixels SP1, SP2, SP3 and SP4 on the first planarizing layer 152.

The first electrode 160, the light emitting layer 162 and the second electrode 164 constitute a light emitting diode emitting a white colored light. The first electrode 160 may be disposed in each of the first, second, third and fourth subpixels SP1, SP2, SP3 and SP4, and each of the light emitting layer 162 and the second electrode 164 may be disposed in a whole of the first, second, third and fourth subpixels SP1, SP2, SP3 and SP4.

The first and second electrodes 160 and 164 may be an anode and a cathode, respectively.

Although not shown, an encapsulating layer and an encapsulating substrate may be disposed on the second electrode 164.

The light emitting layer 162 may have a plurality of stacks.

Figure 7:
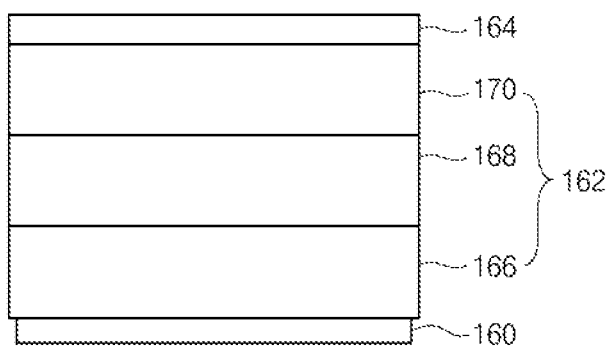
FIG. 7 is a cross-sectional view showing a light emitting diode of an organic light emitting diode display device according to the first aspect of the present disclosure.
Figure 8:
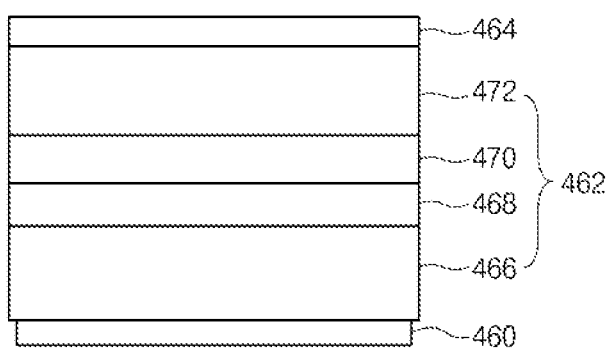
FIG. 8 is a cross-sectional view showing a light emitting diode of an organic light emitting diode display device according to a fourth aspect of the present disclosure.

FIGS. 7 and 8 are cross-sectional views showing a light emitting diode of an organic light emitting diode display device according to first and fourth aspects, respectively, of the present disclosure.

In FIG. 7, the light emitting diode of the OLED display device 110 according to a first aspect of the present disclosure includes the first electrode 160, the light emitting layer 162 and the second electrode 164.

The light emitting layer 162 includes first, second and third emitting material layers (EMLs) 166, 168 and 170 sequentially disposed on the first electrode 160. The first, second and third EMLs 166, 168 and 170 may emit a first blue colored light, a yellow-green colored light and a second blue colored light, respectively.

Although not shown, a hole injecting layer (HIL) and a first hole transporting layer (HTL) may be disposed between the first electrode 160 and the first EML 166.

A first electron transporting layer (ETL), a first charge generating layer (CGL) and a second HTL may be disposed between the first EML 166 and the second EML 168.

A second ETL, a second CGL and a third HTL may be disposed between the second EML 168 and the third EML 170.

A third ETL and an electron injecting layer (EIL) may be disposed between the third EML 170 and the second electrode 164.

The HIL, the first HTL, the first EML 166 and the first ETL may constitute a first stack for emitting a first blue colored light, and the second HTL, the second EML 168 and the second ETL may constitute a second stack for emitting a yellow-green colored light. The third HTL, the third EML 170, the third ETL and the EIL may constitute a third stack for emitting a second blue colored light.

As a result, the light emitting diode of the OLED display device 110 according to a first aspect of the present disclosure may emit a white colored light where the first blue colored light, the yellow-green colored light and the second blue colored light of the first, second and third stacks are mixed.

In FIG. 8, a light emitting diode of an OLED display device according to a fourth aspect of the present disclosure includes a first electrode 460, a light emitting layer 462 and a second electrode 464.

The light emitting layer 462 includes first, second, third and fourth emitting material layers (EMLs) 466, 468, 470 and 472 sequentially disposed on the first electrode 460. The first, second, third and fourth EMLs 466, 468, 470 and 472 may emit a first blue colored light, a yellow-green colored light, a green colored light and a second blue colored light, respectively.

Although not shown, a hole injecting layer (HIL) and a first hole transporting layer (HTL) may be disposed between the first electrode 460 and the first EML 466.

A first electron transporting layer (ETL), a first charge generating layer (CGL) and a second HTL may be disposed between the first EML 466 and the second EML 468.

A second ETL, a second CGL and a third HTL may be disposed between the third EML 470 and the fourth EML 472.

A third ETL and an electron injecting layer (EIL) may be disposed between the fourth EML 472 and the second electrode 464.

The HIL, the first HTL, the first EML 466 and the first ETL may constitute a first stack for emitting a first blue colored light, and the second HTL, the second EML 468, the third EML 470 and the second ETL may constitute a second stack for emitting a yellow-green colored light and a green colored light. The third HTL, the fourth EML 472, the third ETL and the EIL may constitute a third stack for emitting a second blue colored light.

As a result, the light emitting diode of the OLED display device according to a fourth aspect of the present disclosure may emit a white colored light where the first blue colored light, the yellow-green colored light, the green colored light and the second blue colored light of the first, second, third and fourth stacks are mixed.

Referring again to FIG. 3, a first light L1 of the light emitting layer 162 is converted into fourth, fifth, sixth and seventh lights L4, L5, L6 and L7 by the first, second, third and fourth subpixels SP1, SP2, SP3 and SP4, respectively, and the fourth, fifth, sixth and seventh lights L4, L5, L6 and L7 are emitted from the first, second, third and fourth subpixels SP1, SP2, SP3 and SP4, respectively.

In the first subpixel SP1, the first light L1 of the light emitting layer 162 passes through a gap region between the first and second wavelength converting patterns 142 and 144 of the first wavelength converting layer 146 without conversion to be emitted as the first light L1. The first light L1 is converted by the first wavelength converting pattern 142 of the first wavelength converting layer 146 to be emitted as the second light L2, and the first light L1 is converted by the second wavelength converting pattern 144 of the first wavelength converting layer 146 to be emitted as the third light L3.

The first light L1 of the light emitting layer 162 is converted into the fourth light L4 where the first light L1 passing through the gap region between the first and second wavelength converting patterns 142 and 144, the second light L2 due to the first wavelength converting pattern 142 and the third light L3 due to the second wavelength converting pattern 144 are mixed, and the fourth light L4 is emitted from the first subpixel SP1.

In the second subpixel SP2, the first light L1 of the light emitting layer 162 is converted into the second light L2 by the second wavelength converting layer 148, and the second light L2 of the second wavelength converting layer 148 is converted by the first color filter layer 132 to be emitted as the fifth light L5.

The first light L1 of the light emitting layer 162 is converted into the fifth light L5 by the second wavelength converting layer 148 and the first color filter layer 132, and the fifth light L5 is emitted from the second subpixel SP2.

In the third subpixel SP3, the first light L1 of the light emitting layer 162 is converted into the third light L3 by the third wavelength converting layer 150, and the third light L3 of the third wavelength converting layer 150 is converted by the second color filter layer 134 to be emitted as the sixth light L6.

The first light L1 of the light emitting layer 162 is converted into the sixth light L6 by the third wavelength converting layer 150 and the second color filter layer 134, and the sixth light L6 is emitted from the third subpixel SP3.

In the fourth subpixel SP4, the first light L1 of the light emitting layer 162 is converted by the third color filter layer 136 to be emitted as the seventh light L7.

The first light L1 of the light emitting layer 162 is converted into the seventh light L7 by the third color filter layer 136, and the seventh light L7 is emitted from the fourth subpixel SP4.

The fourth, fifth, sixth and seventh lights L4, L5, L6 and L7 may be white, red, green and blue colored lights, respectively.

Figure 9:
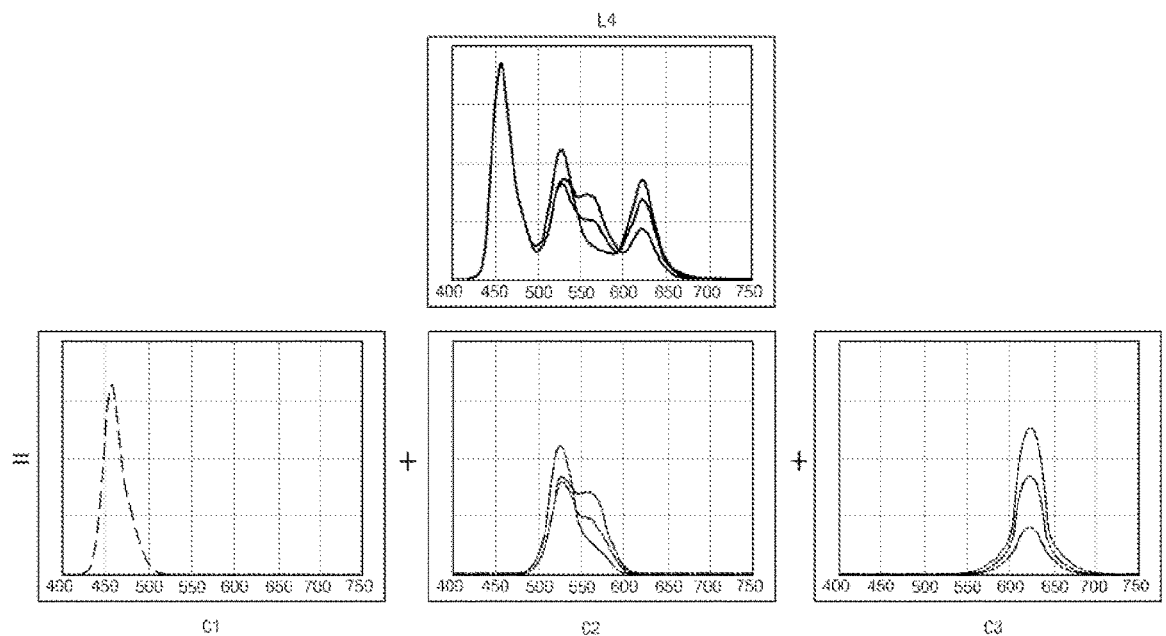
FIG. 9 is a view showing a spectrum of a fourth light of a first subpixel of an organic light emitting diode display device according to the first aspect of the present disclosure.
Figure 10:
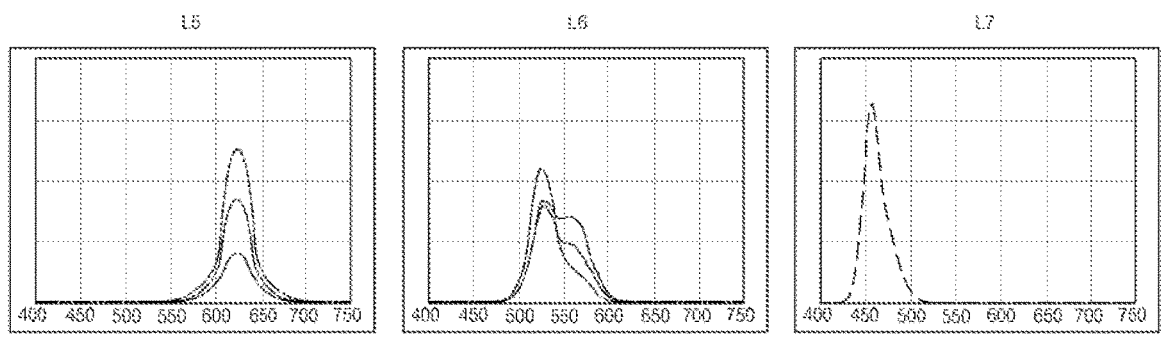
FIG. 10 is a view showing spectrums of fifth, sixth and seventh lights of second, third and fourth subpixels of an organic light emitting diode display device according to the first aspect of the present disclosure.

FIG. 9 is a view showing a spectrum of a fourth light of a first subpixel of an organic light emitting diode display device according to a first aspect of the present disclosure, and FIG. 10 is a view showing spectrums of fifth, sixth and seventh lights of second, third and fourth subpixels of an organic light emitting diode display device according to a first aspect of the present disclosure.

In FIG. 9, the fourth light L4 emitted from the first subpixel SP1 of the OLED display device 110 according to a first aspect of the present disclosure may be a white colored light including a first component C1 corresponding to a blue colored light, a second component C2 corresponding to a green colored light and a third component C3 corresponding to a red colored light.

Spectrums (intensities with respect to wavelengths) of the second and third components C2 and C3 may be variously adjusted by changing a composition ratio or a sort of substances of the first and second wavelength converting materials of the first and second wavelength converting patterns 142 and 144 of the first wavelength converting layer 146. As a result, a spectrum of the fourth light L4 emitted from the first subpixel SP1 may be variously adjusted.

In FIG. 10, the fifth, sixth and seventh lights L5, L6 and L7 emitted from the second, third and fourth subpixels SP2, SP3 and SP4 of the OLED display device 110 according to a first aspect of the present disclosure may be red, green and blue colored lights, respectively.

A spectrum of the fifth light L5 emitted from the second subpixel SP2 may be variously adjusted by changing a composition ratio or a sort of substances of the third wavelength converting material of the second wavelength converting layer 148.

A spectrum of the sixth light L6 emitted from the third subpixel SP3 may be variously adjusted by changing a composition ratio or a sort of substances of the fourth wavelength converting material of the third wavelength converting layer 150.

In the OLED display device 110 according to a first aspect of the present disclosure, the white spectrum of the fourth light L4 of the first subpixel SP1, the red spectrum of the fifth light L5 of the second subpixel SP2 and the green spectrum of the sixth light L6 of the third subpixel SP3 may be variously adjusted by changing a composition ratio or a sort of substances of the first, second, third and fourth wavelength converting materials. Accordingly, various white spectrums of a high color temperature and a high luminance may be obtained.

In addition, since the white colored light of the light emitting layer 162 is converted into the red colored light and the green colored light using the second and third wavelength converting patterns 148 and 150 of the second and third subpixels SP2 and SP3, thicknesses of the first and second color filter layers 132 and 134 of the second and third subpixel SP2 and SP3 is reduced. As a result, a light emitting efficiency is improved.

Further, since the red, green and blue colored lights are emitted through the first, second and third color filters 132, 134 and 136, respectively, of the second, third and fourth subpixels SP2, SP3 and SP4, a color reproducibility is improved.

In another aspect, a light extraction efficiency may be improved using a microlens.

Figure 11:
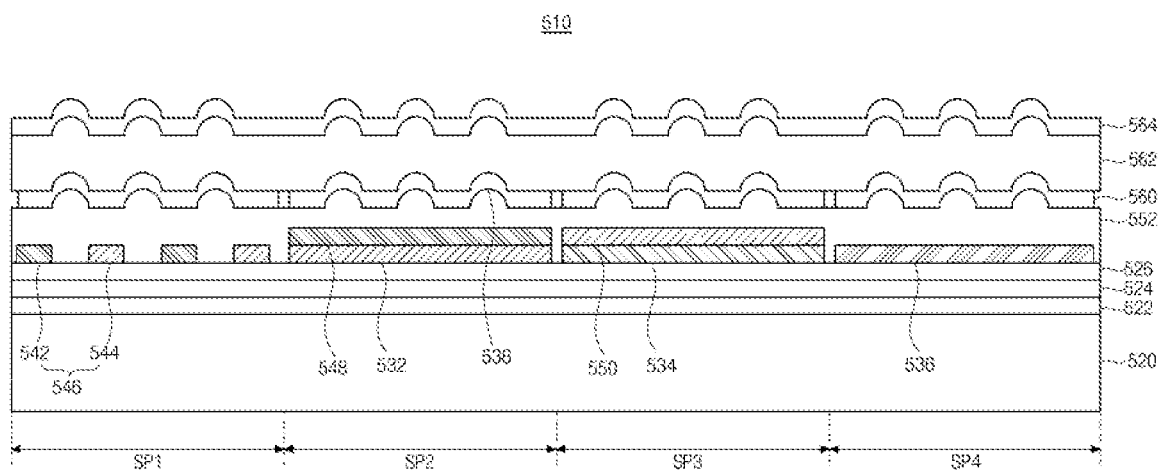
FIG. 11 is a cross-sectional view showing an organic light emitting diode display device according to a fifth aspect of the present disclosure.

FIG. 11 is a cross-sectional view showing an organic light emitting diode display device according to a fifth aspect of the present disclosure. Illustrations on parts of the fifth aspect the same as those of the first aspect will be omitted.

In FIG. 11, the OLED display device 510 includes a substrate 520, insulating layers 522, 524 and 526, color filter layers 532, 534 and 536, wavelength converting layers 546, 548 and 550, a plurality of microlenses 538, a first electrode 560, a light emitting layer 562 and a second electrode 564.

The substrate 520 includes first to fourth subpixels SP1 to SP4. For example, the first, second, third and fourth subpixels SP1, SP2, SP3 and SP4 may correspond to white, red, green and blue colors, respectively.

For example, the first to fourth subpixels SP1 to SP4 may constitute a single pixel. The first subpixel SP1 may have an area ratio of about 0.3 (30%) to about 0.7 (70%) with respect to the single pixel, and each of the second, third and fourth subpixels SP2, SP3 and SP4 may have an area ratio of about 0.1 (10%) to about 0.3 (30%).

A gate insulating layer 522, an interlayer insulating layer 524 and a passivation layer 526 may be disposed in the first, second, third and fourth subpixels SP1, SP2, SP3 and SP4 on the substrate 520, and the switching TFT Ts (shown in FIG. 2), the driving TFT Td (shown in FIG. 2) and the storage capacitor Cs (shown in FIG. 2) may be disposed among the gate insulating layer 522, the interlayer insulating layer 524 and the passivation layer 526.

For example, the gate insulating layer 522 may be disposed between a gate electrode and a semiconductor layer of the switching TFT Ts and the driving TFT Td, and the interlayer insulating layer 524 may be disposed between the gate electrode and a source electrode and between the gate electrode and a drain electrode of the switching TFT Ts and the driving TFT Td. The passivation layer 526 may be disposed on the source electrode and the drain electrode of the switching TFT Ts and the driving TFT Td.

First, second and third color filter layers 532, 534 and 536 may be disposed in the second, third and fourth subpixels SP2, SP3 and SP4 on the passivation layer 526.

A first wavelength converting layer 546 is disposed in the first subpixel SP1 on the passivation layer 526, and second and third wavelength converting layers 548 and 550 are disposed on the first and second color filter layers 532 and 534, respectively.

The first wavelength converting layer 546 includes first and second wavelength converting materials, and the second wavelength converting layer 548 includes a third wavelength converting material. The third wavelength converting layer 550 includes a fourth wavelength converting material.

For example, the first, second, third and fourth wavelength converting materials may include a quantum dot or a nanocomposite capable of adjusting an absorption wavelength band and an emission wavelength band according to a concentration or a sort of substances.

The first, second, third and fourth wavelength converting materials may have an absorption wavelength band of about 350 nm to about 650 nm and an emission wavelength band of about 450 nm to about 750 nm. An absorption ratio by wavelength and an emission ratio by wavelength of the first, second, third and fourth wavelength converting materials may be adjusted according to a composition ratio or a sort of substances.

For example, the first and third wavelength converting materials may absorb a blue colored light and may emit a red colored light, and the second and fourth wavelength converting materials may absorb a blue colored light and may emit a green colored light.

A first planarizing layer 552 is disposed on the first, second and third wavelength converting layers 546, 548 and 550 and the third color filter layer 536, and a plurality of microlenses 538 having an uneven shape are disposed on a top surface of the first planarizing layer 552.

For example, the first planarizing layer 552 and the plurality of microlenses 538 may include an organic insulating material such as a photo acryl.

In addition, the first planarizing layer 552 and the plurality of microlenses 538 may be formed through a single photolithographic process using a half transmissive mask including a transmissive area, a half transmissive area and a blocking area.

The first planarizing layer 552 and the plurality of microlenses 538 may have the same refractive index. For example, each of the first planarizing layer 552 and the plurality of microlenses 538 may have a refractive index of about 1.45 to about 1.55.

Each of the plurality of microlenses 538 may have a shape of a convex lens.

Although the plurality of microlenses 538 are spaced apart from each other in the fifth aspect, at least two of the plurality of microlenses 538 may contact each other in another aspect.

A first electrode 560, a light emitting layer 562 and a second electrode 564 are sequentially disposed in the first, second, third and fourth subpixels SP1, SP2, SP3 and SP4 on the first planarizing layer 552. The first electrode 560, the light emitting layer 562 and the second electrode 564 constitute a light emitting diode emitting a white colored light.

The first electrode 560, the light emitting layer 562 and the second electrode 564 may have an uneven shape due to the plurality of microlenses 538.

In the OLED display device 510 according to a fifth aspect of the present disclosure, a light blocked by a total reflection at an interface between the first electrode 560 and the first planarizing layer 552 is minimized due to the plurality of microlenses 538. As a result, a light emitting efficiency is improved.

In addition, the white spectrum of the first subpixel SP1, the red spectrum of the second subpixel SP2 and the green spectrum of the third subpixel SP3 may be variously adjusted by changing a composition ratio or a sort of substances of the first, second, third and fourth wavelength converting materials. Accordingly, various white spectrums of a high color temperature and a high luminance may be obtained.

Further, since the white colored light of the light emitting layer 562 is converted into the red colored light and the green colored light using the second and third wavelength converting patterns 548 and 550 of the second and third subpixels SP2 and SP3, thicknesses of the first and second color filter layers 532 and 534 of the second and third subpixel SP2 and SP3 is reduced. As a result, a light emitting efficiency is improved.

Moreover, since the red, green and blue colored lights are emitted through the first, second and third color filters 532, 534 and 536, respectively, of the second, third and fourth subpixels SP2, SP3 and SP4, a color reproducibility is improved.

In another aspect, a plurality of microlenses may have a shape of a concave lens and may be disposed to contact each other.

Figure 12:
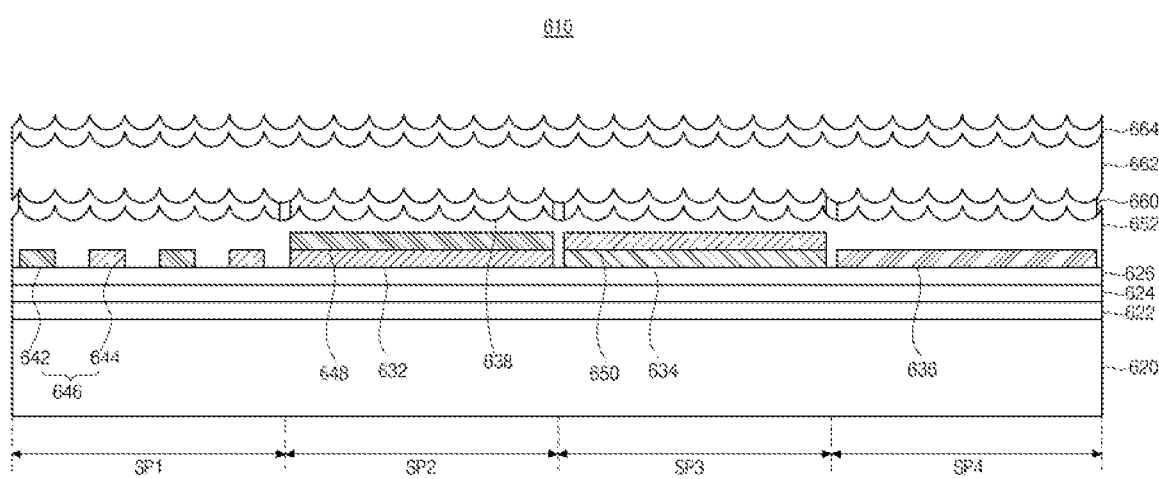
FIG. 12 is a cross-sectional view showing an organic light emitting diode display device according to a sixth aspect of the present disclosure.

FIG. 12 is a cross-sectional view showing an organic light emitting diode display device according to a sixth aspect of the present disclosure. Illustrations on parts of the sixth aspect the same as those of the first aspect will be omitted.

In FIG. 12, the OLED display device 610 includes a substrate 620, insulating layers 622, 624 and 626, color filter layers 632, 634 and 636, wavelength converting layers 646, 648 and 650, a plurality of microlenses 638, a first electrode 660, a light emitting layer 662 and a second electrode 664.

The substrate 620 includes first to fourth subpixels SP1 to SP4. For example, the first, second, third and fourth subpixels SP1, SP2, SP3 and SP4 may correspond to white, red, green and blue colors, respectively.

For example, the first to fourth subpixels SP1 to SP4 may constitute a single pixel. The first subpixel SP1 may have an area ratio of about 0.3 (30%) to about 0.7 (70%) with respect to the single pixel, and each of the second, third and fourth subpixels SP2, SP3 and SP4 may have an area ratio of about 0.1 (10%) to about 0.3 (30%).

A gate insulating layer 622, an interlayer insulating layer 624 and a passivation layer 626 may be disposed in the first, second, third and fourth subpixels SP1, SP2, SP3 and SP4 on the substrate 620, and the switching TFT Ts (shown in FIG. 2), the driving TFT Td (shown in FIG. 2) and the storage capacitor Cs (shown in FIG. 2) may be disposed among the gate insulating layer 622, the interlayer insulating layer 624 and the passivation layer 626.

For example, the gate insulating layer 622 may be disposed between a gate electrode and a semiconductor layer of the switching TFT Ts and the driving TFT Td, and the interlayer insulating layer 624 may be disposed between the gate electrode and a source electrode and between the gate electrode and a drain electrode of the switching TFT Ts and the driving TFT Td. The passivation layer 626 may be disposed on the source electrode and the drain electrode of the switching TFT Ts and the driving TFT Td.

First, second and third color filter layers 632, 634 and 636 may be disposed in the second, third and fourth subpixels SP2, SP3 and SP4 on the passivation layer 626.

A first wavelength converting layer 646 is disposed in the first subpixel SP1 on the passivation layer 626, and second and third wavelength converting layers 648 and 650 are disposed on the first and second color filter layers 632 and 634, respectively.

The first wavelength converting layer 646 includes first and second wavelength converting materials, and the second wavelength converting layer 648 includes a third wavelength converting material. The third wavelength converting layer 650 includes a fourth wavelength converting material.

For example, the first, second, third and fourth wavelength converting materials may include a quantum dot or a nanocomposite capable of adjusting an absorption wavelength band and an emission wavelength band according to a concentration or a sort of substances.

The first, second, third and fourth wavelength converting materials may have an absorption wavelength band of about 350 nm to about 650 nm and an emission wavelength band of about 450 nm to about 750 nm. An absorption ratio by wavelength and an emission ratio by wavelength of the first, second, third and fourth wavelength converting materials may be adjusted according to a composition ratio or a sort of substances.

For example, the first and third wavelength converting materials may absorb a blue colored light and may emit a red colored light, and the second and fourth wavelength converting materials may absorb a blue colored light and may emit a green colored light.

A first planarizing layer 652 is disposed on the first, second and third wavelength converting layers 646, 648 and 650 and the third color filter layer 636, and a plurality of microlenses 638 having an uneven shape are disposed on a top surface of the first planarizing layer 652.

For example, the first planarizing layer 652 and the plurality of microlenses 638 may include an organic insulating material such as a photo acryl.

In addition, the first planarizing layer 652 and the plurality of microlenses 638 may be formed through a single photolithographic process using a half transmissive mask including a transmissive area, a half transmissive area and a blocking area.

The first planarizing layer 652 and the plurality of microlenses 638 may have the same refractive index. For example, each of the first planarizing layer 652 and the plurality of microlenses 638 may have a refractive index of about 1.45 to about 1.55.

Each of the plurality of microlenses 638 may have a shape of a concave lens and may be disposed to contact each other.

Although the plurality of microlenses 638 contact each other in the sixth aspect, at least two of the plurality of microlenses 638 may be spaced apart from each other in another aspect.

A first electrode 660, a light emitting layer 662 and a second electrode 664 are sequentially disposed in the first, second, third and fourth subpixels SP1, SP2, SP3 and SP4 on the first planarizing layer 652. The first electrode 660, the light emitting layer 662 and the second electrode 664 constitute a light emitting diode emitting a white colored light.

The first electrode 660, the light emitting layer 662 and the second electrode 664 may have an uneven shape due to the plurality of microlenses 638.

In the OLED display device 610 according to a sixth aspect of the present disclosure, a light blocked by a total reflection at an interface between the first electrode 660 and the first planarizing layer 652 is minimized due to the plurality of microlenses 638. As a result, a light emitting efficiency is improved.

In addition, the white spectrum of the first subpixel SP1, the red spectrum of the second subpixel SP2 and the green spectrum of the third subpixel SP3 may be variously adjusted by changing a composition ratio or a sort of substances of the first, second, third and fourth wavelength converting materials. Accordingly, various white spectrums of a high color temperature and a high luminance may be obtained.

Further, since the white colored light of the light emitting layer 662 is converted into the red colored light and the green colored light using the second and third wavelength converting patterns 648 and 650 of the second and third subpixels SP2 and SP3, thicknesses of the first and second color filter layers 632 and 634 of the second and third subpixel SP2 and SP3 is reduced. As a result, a light emitting efficiency is improved.

Moreover, since the red, green and blue colored lights are emitted through the first, second and third color filters 632, 634 and 636, respectively, of the second, third and fourth subpixels SP2, SP3 and SP4, a color reproducibility is improved.

Figure 13:
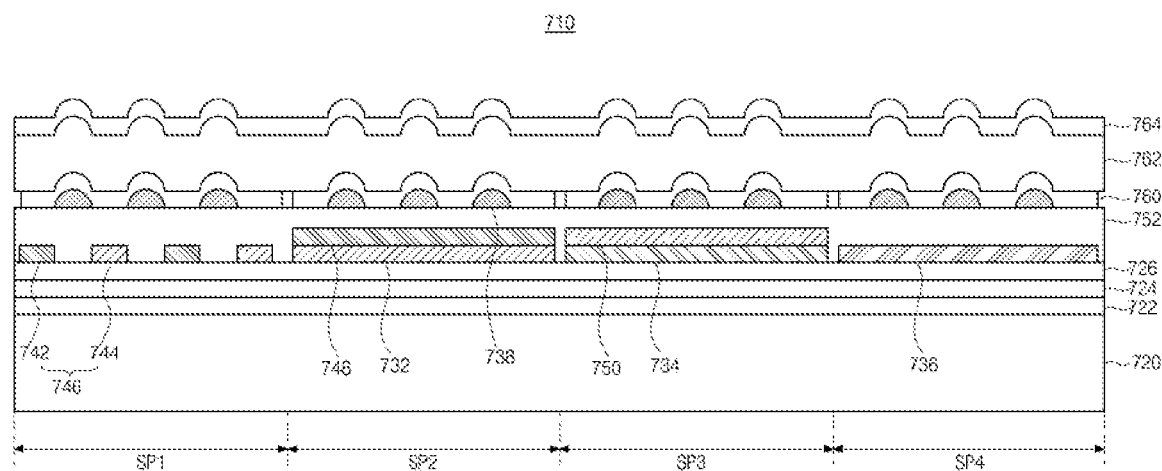
FIG. 13 is a cross-sectional view showing an organic light emitting diode display device according to a seventh aspect of the present disclosure.

FIG. 13 is a cross-sectional view showing an organic light emitting diode display device according to a seventh aspect of the present disclosure. Illustrations on parts of the seventh aspect the same as those of the first aspect will be omitted.

In FIG. 13, the OLED display device 710 includes a substrate 720, insulating layers 722, 724 and 726, color filter layers 732, 734 and 736, wavelength converting layers 746, 748 and 750, a plurality of microlenses 738, a first electrode 760, a light emitting layer 762 and a second electrode 764.

The substrate 720 includes first to fourth subpixels SP1 to SP4. For example, the first, second, third and fourth subpixels SP1, SP2, SP3 and SP4 may correspond to white, red, green and blue colors, respectively.

For example, the first to fourth subpixels SP1 to SP4 may constitute a single pixel. The first subpixel SP1 may have an area ratio of about 0.3 (30%) to about 0.7 (70%) with respect to the single pixel, and each of the second, third and fourth subpixels SP2, SP3 and SP4 may have an area ratio of about 0.1 (10%) to about 0.3 (30%).

A gate insulating layer 722, an interlayer insulating layer 724 and a passivation layer 726 may be disposed in the first, second, third and fourth subpixels SP1, SP2, SP3 and SP4 on the substrate 720, and the switching TFT Ts (shown in FIG. 2), the driving TFT Td (shown in FIG. 2) and the storage capacitor Cs (shown in FIG. 2) may be disposed among the gate insulating layer 722, the interlayer insulating layer 724 and the passivation layer 726.

For example, the gate insulating layer 722 may be disposed between a gate electrode and a semiconductor layer of the switching TFT Ts and the driving TFT Td, and the interlayer insulating layer 724 may be disposed between the gate electrode and a source electrode and between the gate electrode and a drain electrode of the switching TFT Ts and the driving TFT Td. The passivation layer 726 may be disposed on the source electrode and the drain electrode of the switching TFT Ts and the driving TFT Td.

First, second and third color filter layers 732, 734 and 736 may be disposed in the second, third and fourth subpixels SP2, SP3 and SP4 on the passivation layer 726.

A first wavelength converting layer 746 is disposed in the first subpixel SP1 on the passivation layer 726, and second and third wavelength converting layers 748 and 750 are disposed on the first and second color filter layers 732 and 734, respectively.

The first wavelength converting layer 746 includes first and second wavelength converting materials, and the second wavelength converting layer 748 includes a third wavelength converting material. The third wavelength converting layer 750 includes a fourth wavelength converting material.

For example, the first, second, third and fourth wavelength converting materials may include a quantum dot or a nanocomposite capable of adjusting an absorption wavelength band and an emission wavelength band according to a concentration or a sort of substances.

The first, second, third and fourth wavelength converting materials may have an absorption wavelength band of about 350 nm to about 650 nm and an emission wavelength band of about 450 nm to about 750 nm. An absorption ratio by wavelength and an emission ratio by wavelength of the first, second, third and fourth wavelength converting materials may be adjusted according to a composition ratio or a sort of substances.

For example, the first and third wavelength converting materials may absorb a blue colored light and may emit a red colored light, and the second and fourth wavelength converting materials may absorb a blue colored light and may emit a green colored light.

A first planarizing layer 752 is disposed on the first, second and third wavelength converting layers 746, 748 and 750 and the third color filter layer 736, and a plurality of microlenses 738 having an uneven shape are disposed on a top surface of the first planarizing layer 752.

For example, the first planarizing layer 752 and the plurality of microlenses 738 may include an organic insulating material such as a photo acryl.

The first planarizing layer 752 and the plurality of microlenses 738 may have the different refractive indexes. For example, a refractive index of the first planarizing layer 752 may be greater than a refractive index of the plurality of microlenses 738.

For example, the first planarizing layer 752 may have a refractive index of about 1.45 to about 1.55, and the plurality of microlenses 738 may have a refractive index equal to or smaller than about 1.4.

Although each of the plurality of microlenses 738 exemplarily has a shape of a convex lens in the seventh aspect, each of the plurality of microlenses 738 may have a shape of a concave lens in another aspect.

Although the plurality of microlenses 738 are spaced apart from each other in the seventh aspect, at least two of the plurality of microlenses 738 may contact each other in another aspect.

A first electrode 760, a light emitting layer 762 and a second electrode 764 are sequentially disposed in the first, second, third and fourth subpixels SP1, SP2, SP3 and SP4 on the first planarizing layer 752. The first electrode 760, the light emitting layer 762 and the second electrode 764 constitute a light emitting diode emitting a white colored light.

The first electrode 760, the light emitting layer 762 and the second electrode 764 may have an uneven shape due to the plurality of microlenses 738.

In the OLED display device 710 according to a seventh aspect of the present disclosure, a light blocked by a total reflection at an interface between the first electrode 760 and the first planarizing layer 752 is minimized due to the plurality of microlenses 738. As a result, a light emitting efficiency is improved.

In addition, the white spectrum of the first subpixel SP1, the red spectrum of the second subpixel SP2 and the green spectrum of the third subpixel SP3 may be variously adjusted by changing a composition ratio or a sort of substances of the first, second, third and fourth wavelength converting materials. Accordingly, various white spectrums of a high color temperature and a high luminance may be obtained.

Further, since the white colored light of the light emitting layer 762 is converted into the red colored light and the green colored light using the second and third wavelength converting patterns 748 and 750 of the second and third subpixels SP2 and SP3, thicknesses of the first and second color filter layers 732 and 734 of the second and third subpixel SP2 and SP3 is reduced. As a result, a light emitting efficiency is improved.

Moreover, since the red, green and blue colored lights are emitted through the first, second and third color filters 732, 734 and 736, respectively, of the second, third and fourth subpixels SP2, SP3 and SP4, a color reproducibility is improved.

Figure 14:
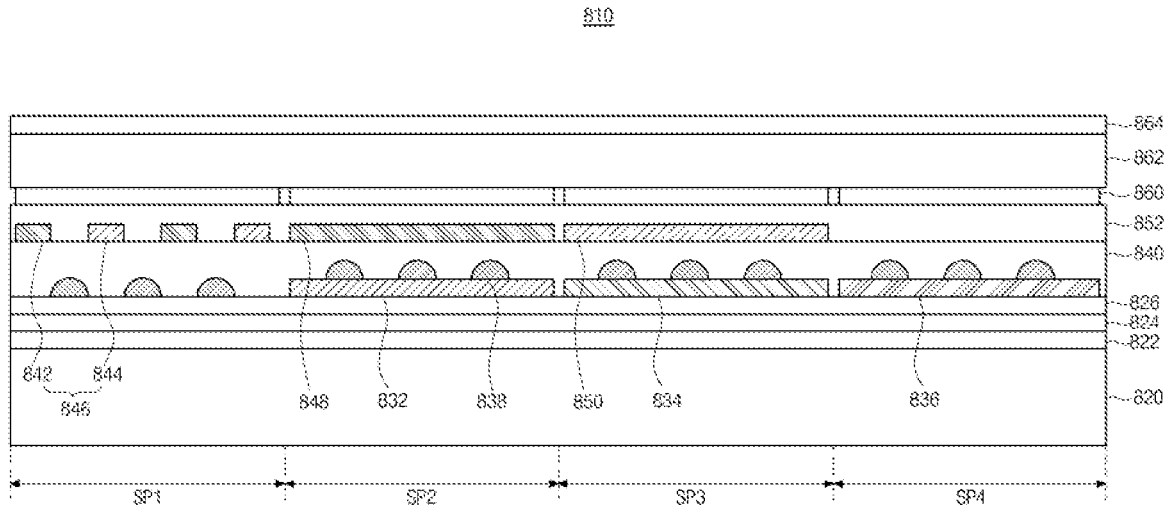
FIG. 14 is a cross-sectional view showing an organic light emitting diode display device according to an eighth aspect of the present disclosure.

FIG. 14 is a cross-sectional view showing an organic light emitting diode display device according to an eighth aspect of the present disclosure. Illustrations on parts of the eighth aspect the same as those of the first aspect will be omitted.

In FIG. 14, the OLED display device 810 includes a substrate 820, insulating layers 822, 824 and 826, color filter layers 832, 834 and 836, wavelength converting layers 846, 848 and 850, a plurality of microlenses 838, a first electrode 860, a light emitting layer 862 and a second electrode 864.

The substrate 820 includes first to fourth subpixels SP1 to SP4. For example, the first, second, third and fourth subpixels SP1, SP2, SP3 and SP4 may correspond to white, red, green and blue colors, respectively.

For example, the first to fourth subpixels SP1 to SP4 may constitute a single pixel. The first subpixel SP1 may have an area ratio of about 0.3 (30%) to about 0.7 (70%) with respect to the single pixel, and each of the second, third and fourth subpixels SP2, SP3 and SP4 may have an area ratio of about 0.1 (10%) to about 0.3 (30%).

A gate insulating layer 822, an interlayer insulating layer 824 and a passivation layer 826 may be disposed in the first, second, third and fourth subpixels SP1, SP2, SP3 and SP4 on the substrate 820, and the switching TFT Ts (shown in FIG. 2), the driving TFT Td (shown in FIG. 2) and the storage capacitor Cs (shown in FIG. 2) may be disposed among the gate insulating layer 822, the interlayer insulating layer 824 and the passivation layer 826.

For example, the gate insulating layer 822 may be disposed between a gate electrode and a semiconductor layer of the switching TFT Ts and the driving TFT Td, and the interlayer insulating layer 824 may be disposed between the gate electrode and a source electrode and between the gate electrode and a drain electrode of the switching TFT Ts and the driving TFT Td. The passivation layer 826 may be disposed on the source electrode and the drain electrode of the switching TFT Ts and the driving TFT Td.

First, second and third color filter layers 832, 834 and 836 may be disposed in the second, third and fourth subpixels SP2, SP3 and SP4 on the passivation layer 826.

A plurality of microlenses 838 having an uneven shape are disposed on the passivation layer 826 in the first subpixel SP1 and on the first, second and third color filter layers 832, 834 and 836, and a first planarizing layer 840 is disposed on the plurality of microlenses 838.

First, second and third wavelength converting layers 846, 848 and 850 are disposed on the first planarizing layer 840 in the first, second and third subpixels SP1, SP2 and SP3, respectively.

The first wavelength converting layer 846 includes first and second wavelength converting materials, and the second wavelength converting layer 848 includes a third wavelength converting material. The third wavelength converting layer 850 includes a fourth wavelength converting material.

For example, the first, second, third and fourth wavelength converting materials may include a quantum dot or a nanocomposite capable of adjusting an absorption wavelength band and an emission wavelength band according to a concentration or a sort of substances.

The first, second, third and fourth wavelength converting materials may have an absorption wavelength band of about 350 nm to about 650 nm and an emission wavelength band of about 450 nm to about 750 nm. An absorption ratio by wavelength and an emission ratio by wavelength of the first, second, third and fourth wavelength converting materials may be adjusted according to a composition ratio or a sort of substances.

For example, the first and third wavelength converting materials may absorb a blue colored light and may emit a red colored light, and the second and fourth wavelength converting materials may absorb a blue colored light and may emit a green colored light.

A second planarizing layer 852 is disposed on the first, second and third wavelength converting layers 846, 848 and 850 and on the first planarizing layer 840 of the fourth subpixel SP4.

For example, the first and second planarizing layers 840 and 852 and the plurality of microlenses 838 may include an organic insulating material such as a photo acryl.

The first and second planarizing layers 840 and 852 may have the same refractive index, and the first and second planarizing layers 840 and 852 and the plurality of microlenses 838 may have the different refractive indexes.

For example, the first and second planarizing layers 840 and 852 may have a refractive index of about 1.45 to about 1.55, and the plurality of microlenses 838 may have a refractive index equal to or smaller than about 1.4.

Although each of the plurality of microlenses 838 exemplarily has a shape of a convex lens in the eighth aspect, each of the plurality of microlenses 838 may have a shape of a concave lens in another aspect.

Although the plurality of microlenses 838 are spaced apart from each other in the eighth aspect, at least two of the plurality of microlenses 838 may contact each other in another aspect.

A first electrode 860, a light emitting layer 862 and a second electrode 864 are sequentially disposed in the first, second, third and fourth subpixels SP1, SP2, SP3 and SP4 on the second planarizing layer 852. The first electrode 860, the light emitting layer 862 and the second electrode 864 constitute a light emitting diode emitting a white colored light.

In the OLED display device 810 according to an eighth aspect of the present disclosure, a light blocked by a total reflection at an interface between the first planarizing layer 840 and the substrate 820 and at an interface between the first planarizing layer 840 and the color filter layers 832, 834 and 836 is minimized due to the plurality of microlenses 838. As a result, a light emitting efficiency is improved.

In addition, the white spectrum of the first subpixel SP1, the red spectrum of the second subpixel SP2 and the green spectrum of the third subpixel SP3 may be variously adjusted by changing a composition ratio or a sort of substances of the first, second, third and fourth wavelength converting materials. Accordingly, various white spectrums of a high color temperature and a high luminance may be obtained.

Further, since the white colored light of the light emitting layer 862 is converted into the red colored light and the green colored light using the second and third wavelength converting patterns 848 and 850 of the second and third subpixels SP2 and SP3, thicknesses of the first and second color filter layers 832 and 834 of the second and third subpixel SP2 and SP3 is reduced. As a result, a light emitting efficiency is improved.

Moreover, since the red, green and blue colored lights are emitted through the first, second and third color filters 832, 834 and 836, respectively, of the second, third and fourth subpixels SP2, SP3 and SP4, a color reproducibility is improved.

Figure 15:
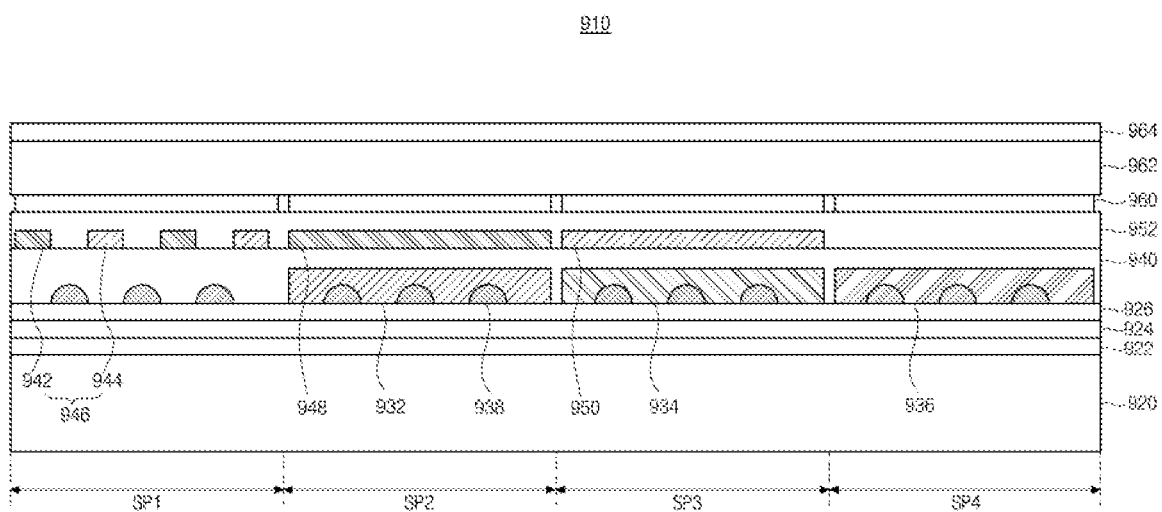
FIG. 15 is a cross-sectional view showing an organic light emitting diode display device according to a ninth aspect of the present disclosure.

FIG. 15 is a cross-sectional view showing an organic light emitting diode display device according to a ninth aspect of the present disclosure. Illustrations on parts of the ninth aspect the same as those of the first aspect will be omitted.

In FIG. 15, the OLED display device 910 includes a substrate 920, insulating layers 922, 924 and 926, color filter layers 932, 934 and 936, wavelength converting layers 946, 948 and 950, a plurality of microlenses 938, a first electrode 960, a light emitting layer 962 and a second electrode 964.

The substrate 920 includes first to fourth subpixels SP1 to SP4. For example, the first, second, third and fourth subpixels SP1, SP2, SP3 and SP4 may correspond to white, red, green and blue colors, respectively.

For example, the first to fourth subpixels SP1 to SP4 may constitute a single pixel. The first subpixel SP1 may have an area ratio of about 0.3 (30%) to about 0.7 (70%) with respect to the single pixel, and each of the second, third and fourth subpixels SP2, SP3 and SP4 may have an area ratio of about 0.1 (10%) to about 0.3 (30%).

A gate insulating layer 922, an interlayer insulating layer 924 and a passivation layer 926 may be disposed in the first, second, third and fourth subpixels SP1, SP2, SP3 and SP4 on the substrate 920, and the switching TFT Ts (shown in FIG. 2), the driving TFT Td (shown in FIG. 2) and the storage capacitor Cs (shown in FIG. 2) may be disposed among the gate insulating layer 922, the interlayer insulating layer 924 and the passivation layer 926.

For example, the gate insulating layer 922 may be disposed between a gate electrode and a semiconductor layer of the switching TFT Ts and the driving TFT Td, and the interlayer insulating layer 924 may be disposed between the gate electrode and a source electrode and between the gate electrode and a drain electrode of the switching TFT Ts and the driving TFT Td. The passivation layer 926 may be disposed on the source electrode and the drain electrode of the switching TFT Ts and the driving TFT Td.

A plurality of microlenses 938 having an uneven shape are disposed on the passivation layer 926 in the first, second, third and fourth subpixels SP1, SP2, SP3 and SP4.

First, second and third color filter layers 932, 934 and 936 may be disposed in the second, third and fourth subpixels SP2, SP3 and SP4 on the plurality of microlenses 938.

A first planarizing layer 940 is disposed on the plurality of microlenses 938 of the first subpixel SP1 and on the first, second and third color filter layers 932, 934 and 936.

First, second and third wavelength converting layers 946, 948 and 950 are disposed on the first planarizing layer 940 in the first, second and third subpixels SP1, SP2 and SP3, respectively.

The first wavelength converting layer 946 includes first and second wavelength converting materials, and the second wavelength converting layer 948 includes a third wavelength converting material. The third wavelength converting layer 950 includes a fourth wavelength converting material.

For example, the first, second, third and fourth wavelength converting materials may include a quantum dot or a nanocomposite capable of adjusting an absorption wavelength band and an emission wavelength band according to a concentration or a sort of substances.

The first, second, third and fourth wavelength converting materials may have an absorption wavelength band of about 350 nm to about 650 nm and an emission wavelength band of about 450 nm to about 750 nm. An absorption ratio by wavelength and an emission ratio by wavelength of the first, second, third and fourth wavelength converting materials may be adjusted according to a composition ratio or a sort of substances.

For example, the first and third wavelength converting materials may absorb a blue colored light and may emit a red colored light, and the second and fourth wavelength converting materials may absorb a blue colored light and may emit a green colored light.

A second planarizing layer 952 is disposed on the first, second and third wavelength converting layers 946, 948 and 950 and on the first planarizing layer 940 of the fourth subpixel SP4.

For example, the first and second planarizing layers 940 and 952 and the plurality of microlenses 938 may include an organic insulating material such as a photo acryl.

The first and second planarizing layers 940 and 952 may have the same refractive index, and the first and second planarizing layers 940 and 952 and the plurality of microlenses 938 may have the different refractive indexes.

For example, the first and second planarizing layers 940 and 952 may have a refractive index of about 1.45 to about 1.55, and the plurality of microlenses 938 may have a refractive index equal to or smaller than about 1.4.

Although each of the plurality of microlenses 938 exemplarily has a shape of a convex lens in the ninth aspect, each of the plurality of microlenses 938 may have a shape of a concave lens in another aspect.

Although the plurality of microlenses 938 are spaced apart from each other in the ninth aspect, at least two of the plurality of microlenses 938 may contact each other in another aspect.

A first electrode 960, a light emitting layer 962 and a second electrode 964 are sequentially disposed in the first, second, third and fourth subpixels SP1, SP2, SP3 and SP4 on the second planarizing layer 952. The first electrode 960, the light emitting layer 962 and the second electrode 964 constitute a light emitting diode emitting a white colored light.

In the OLED display device 910 according to a ninth aspect of the present disclosure, a light blocked by a total reflection at an interface between the first planarizing layer 940 and the substrate 920 and at an interface between the color filter layers 932, 934 and 936 and the substrate 920 is minimized due to the plurality of microlenses 938. As a result, a light emitting efficiency is improved.

In addition, the white spectrum of the first subpixel SP1, the red spectrum of the second subpixel SP2 and the green spectrum of the third subpixel SP3 may be variously adjusted by changing a composition ratio or a sort of substances of the first, second, third and fourth wavelength converting materials. Accordingly, various white spectrums of a high color temperature and a high luminance may be obtained.

Further, since the white colored light of the light emitting layer 962 is converted into the red colored light and the green colored light using the second and third wavelength converting patterns 948 and 950 of the second and third subpixels SP2 and SP3, thicknesses of the first and second color filter layers 932 and 934 of the second and third subpixel SP2 and SP3 is reduced. As a result, a light emitting efficiency is improved.

Moreover, since the red, green and blue colored lights are emitted through the first, second and third color filters 932, 934 and 936, respectively, of the second, third and fourth subpixels SP2, SP3 and SP4, a color reproducibility is improved.

Consequently, in the OLED display device according to the present disclosure, since the white colored light of the light emitting layer is converted into the light having a different color using the wavelength converting layer, various white spectrums of a high color temperature and a high luminance may be obtained.

In addition, since the white colored light of the light emitting layer is converted into the light having a different color using the wavelength converting layer and the light having a specific color among the white colored light of the light emitting layer is transmitted through the color filter layer, various white spectrums are obtained and a color reproducibility is improved.

The present disclosure also relates to and is not limited to the following aspects.

In the present disclosure, an organic light emitting diode display device includes: a substrate having first, second, third and fourth subpixels; first, second and third color filter layers in the second, third and fourth subpixels, respectively, on the substrate; a first wavelength converting layer in the first subpixel on the substrate and second and third wavelength converting layers on the first and second color filter layers, respectively; and a light emitting diode in each of the first, second, third and fourth subpixels over the first, second and third wavelength converting.

In the present disclosure, the first wavelength converting layer includes a first wavelength converting pattern of a first wavelength converting material and a second wavelength converting pattern of a second wavelength converting material, and each of the second and third wavelength converting layers includes third and fourth wavelength converting materials.

In the present disclosure, each of the first, second, third and fourth wavelength converting materials includes one of a quantum dot and a nanocomposite.

In the present disclosure, each of the first, second, third and fourth wavelength converting materials has an absorption wavelength band of 350 nm to 650 nm and an emission wavelength band of 450 nm to 750 nm.

In the present disclosure, each of the first and second wavelength converting patterns has one of a shape of a plurality of bars, a shape of a net and a shape of a rectangle.

In the present disclosure, the first, second, third and fourth subpixels correspond to white, red, green and blue colors, respectively, the first, second and third color filter layers selectively transmit red, green and blue colored lights, respectively, the first and third wavelength converting materials absorb the blue colored light and emit the red colored light, and the second and fourth wavelength converting materials absorb the blue colored light and emit the green colored light.

In the present disclosure, the light emitting diode includes a first electrode, a light emitting layer and a second electrode, and the light emitting layer includes first, second and third emitting material layers emitting first blue, yellow-green and second blue colored lights, respectively.

In the present disclosure, the light emitting diode includes a first electrode, a light emitting layer and a second electrode, and the light emitting layer includes first, second, third and fourth emitting material layers emitting first blue, yellow-green, green and second blue colored lights, respectively.

In the present disclosure, the organic light emitting diode display device further includes a plurality of microlenses disposed between the substrate and the light emitting diode and having an uneven shape.

In the present disclosure, each of the plurality of microlenses has one of a shape of a convex lens and a shape of a concave lens.

In the present disclosure, the organic light emitting diode display device further includes a first planarizing layer between the first, second and third wavelength converting layers and the light emitting diode, and the plurality of microlenses are disposed on the first planarizing layer.

In the present disclosure, a refractive index of the first planarizing layer is a same as a refractive index of the plurality of microlenses.

In the present disclosure, a refractive index of the first planarizing layer is greater than a refractive index of the plurality of microlenses.

In the present disclosure, the organic light emitting diode display device further includes: a first planarizing layer between the first, second and third color filter layers and the first, second and third wavelength converting layers; and a second planarizing layer between the first, second and third wavelength converting layers and the light emitting diode, and the plurality of microlenses are disposed between the substrate and the first planarizing layer.

In the present disclosure, the plurality of microlenses are disposed between the first, second and third color filter layers and the first planarizing layer.

In the present disclosure, the plurality of microlenses are disposed between the substrate and the first, second and third color filter layers.

It will be apparent to those skilled in the art that various modifications and variation can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. An organic light emitting diode display device, comprising:
   first, second, third and fourth subpixels disposed on a substrate;
   first, second and third color filter layers respectively disposed in the second, third and fourth subpixels on the substrate;
   a first wavelength converting layer disposed in the first subpixel on the substrate and second and third wavelength converting layers respectively disposed on the first and second color filter layers;
   a light emitting diode disposed in each of the first, second, third and fourth subpixels over the first, second and third wavelength converting layer; and
   a first planarizing layer between the first, second and third wavelength converting layers and the light emitting diode,
   wherein the first planarizing layer directly contacts the third color filter layer.

2. The device of claim 1, wherein the first wavelength converting layer includes a first wavelength converting pattern containing a first wavelength converting material and a second wavelength converting pattern containing a second wavelength converting material, and
   wherein the second and third wavelength converting layers respectively includes third and fourth wavelength converting materials.

3. The device of claim 2, wherein each of the first, second, third and fourth wavelength converting materials includes one of a quantum dot and a nanocomposite.

4. The device of claim 2, wherein each of the first, second, third and fourth wavelength converting materials has an absorption wavelength band of 350 nm to 650 nm and an emission wavelength band of 450 nm to 750 nm.

5. The device of claim 4, wherein each of the first and second wavelength converting patterns has a shape of a plurality of bars, and the wavelength converting layer including the first and second wavelength converting patterns has a shape of a net.

6. The device of claim 2, wherein the first, second, third and fourth subpixels respectively correspond to white, red, green and blue colors,
   wherein the first, second and third color filter layers respectively transmit red, green and blue colored lights,
   wherein the first and third wavelength converting materials absorb the blue colored light and emit the red colored light, and
   wherein the second and fourth wavelength converting materials absorb the blue colored light and emit the green colored light.

7. The device of claim 1, wherein the light emitting diode includes a first electrode, a light emitting layer and a second electrode, and
   wherein the light emitting layer includes first, second and third emitting material layers respectively emitting first blue, yellow-green and second blue colored lights.

8. The device of claim 1, wherein the light emitting diode includes a first electrode, a light emitting layer and a second electrode, and
   wherein the light emitting layer includes first, second, third and fourth emitting material layers respectively emitting first blue, yellow-green, green and second blue colored lights.

9. The device of claim 1, further comprising a plurality of microlenses having an uneven shape and disposed between the substrate and the light emitting diode.

10. The device of claim 9, wherein each of the plurality of microlenses has one of a shape of a convex lens and a shape of a concave lens.

11. The device of claim 9,
    wherein the plurality of microlenses are disposed on the first planarizing layer.

12. The device of claim 11, wherein a refractive index of the first planarizing layer is the same as a refractive index of the plurality of microlenses.

13. The device of claim 11, wherein a refractive index of the first planarizing layer is greater than a refractive index of the plurality of microlenses.

14. An organic light emitting diode display device, comprising:
    first, second, third and fourth subpixels disposed on a substrate;
    first, second and third color filter layers respectively disposed in the second, third and fourth subpixels on the substrate;
    a first wavelength converting layer disposed in the first subpixel on the substrate and second and third wavelength converting layers respectively disposed on the first and second color filter layers; and
    a light emitting diode disposed in each of the first, second, third and fourth subpixels over the first, second and third wavelength converting layer,
    wherein the first wavelength converting layer includes a first wavelength converting pattern containing a first wavelength converting material and a second wavelength converting pattern containing a second wavelength converting material,
    wherein the second and third wavelength converting layers respectively includes third and fourth wavelength converting materials, and
    wherein each of the first and second wavelength converting patterns has one of a shape of a plurality of bars, a shape of a net and a shape of a rectangle.

15. An organic light emitting diode display device comprising:
    first, second, third and fourth subpixels disposed on a substrate;
    first, second and third color filter layers respectively disposed in the second, third and fourth subpixels on the substrate;
    a first wavelength converting layer disposed in the first subpixel on the substrate and second and third wavelength converting layers respectively disposed on the first and second color filter layers;
    a light emitting diode disposed in each of the first, second, third and fourth subpixels over the first, second and third wavelength converting layer;
    a plurality of microlenses having an uneven shape and disposed between the substrate and the light emitting diode;
    a first planarizing layer disposed between the first, second and third color filter layers and the first, second and third wavelength converting layers; and
    a second planarizing layer disposed between the first, second and third wavelength converting layers and the light emitting diode,
    wherein the plurality of microlenses are disposed between the substrate and the first planarizing layer.

16. The device of claim 15, wherein the plurality of microlenses are disposed between the first, second and third color filter layers and the first planarizing layer.

17. The device of claim 15, wherein the plurality of microlenses are disposed between the substrate and the first, second and third color filter layers.

\* \* \* \* \*